(12) United States Patent
Van Gorp et al.

(10) Patent No.: US 10,620,240 B2
(45) Date of Patent: Apr. 14, 2020

(54) MONITORING LOAD OPERATION

(71) Applicant: SCHNEIDER ELECTRIC USA, INC., Palatine, IL (US)

(72) Inventors: John C. Van Gorp, Sidney (CA); Jeffrey W. Yeo, Saanichton (CA); Peter Tovey, Kelowna (CA)

(73) Assignee: SCHNEIDER ELECTRIC USA, INC., Palatine, IL (US)

( * ) Notice: Subject to any disclaimer, the term of this patent is extended or adjusted under 35 U.S.C. 154(b) by 75 days.

(21) Appl. No.: 14/761,130

(22) PCT Filed: Jan. 18, 2013

(86) PCT No.: PCT/US2013/022155
§ 371 (c)(1),
(2) Date: Jul. 15, 2015

(87) PCT Pub. No.: WO2014/109776
PCT Pub. Date: Jul. 17, 2014

(65) Prior Publication Data
US 2015/0362537 A1 Dec. 17, 2015

(51) Int. Cl.
*G06F 1/26* (2006.01)
*G01R 21/00* (2006.01)
*H02J 3/00* (2006.01)
*H02J 9/06* (2006.01)

(52) U.S. Cl.
CPC ............... *G01R 21/00* (2013.01); *H02J 3/00* (2013.01); *H02J 9/061* (2013.01); *H02J 2003/003* (2013.01); *H02J 2003/007* (2013.01); *Y02E 60/76* (2013.01); *Y04S 40/22* (2013.01)

(58) Field of Classification Search
CPC .......................................................... H02J 3/14
USPC ......................................................... 700/291
See application file for complete search history.

(56) References Cited

U.S. PATENT DOCUMENTS

| | | | |
|---|---|---|---|
| 6,313,752 B1 * | 11/2001 | Corrigan | H02H 7/263 324/76.13 |
| 7,719,416 B2 | 5/2010 | Arms et al. | |
| 8,280,657 B2 | 10/2012 | Van Gorp et al. | |
| 2005/0116836 A1 | 6/2005 | Perry et al. | |
| 2007/0050777 A1 * | 3/2007 | Hutchinson | G06F 11/0709 718/104 |

(Continued)

FOREIGN PATENT DOCUMENTS

| | | |
|---|---|---|
| CA | 2689035 A1 | 6/2011 |
| GB | 2472280 A | 2/2011 |

(Continued)

OTHER PUBLICATIONS

Extended European Search Report from corresponding European Application No. 13870469.7 dated Aug. 25, 2016.

(Continued)

*Primary Examiner* — Min Huang
(74) *Attorney, Agent, or Firm* — Lando & Anastasi, LLP

(57) ABSTRACT

A load monitoring system for a facility includes a computer system configured to execute a model of the object, the model configured to estimate a state of the object as a function of measured values of at least one characteristic of the object, receive at least one measured value of the at least one characteristic of the object, and execute, by the computer system, the model to compute an estimated state of the object.

15 Claims, 5 Drawing Sheets

(56) References Cited

U.S. PATENT DOCUMENTS

| | | |
|---|---|---|
| 2008/0189062 A1 | 8/2008 | Scholtz et al. |
| 2008/0272934 A1 | 11/2008 | Wang et al. |
| 2008/0313006 A1 | 12/2008 | Witter et al. |
| 2010/0114390 A1 | 5/2010 | Stevenson et al. |
| 2010/0179704 A1* | 7/2010 | Ozog ............... G06Q 10/06315 700/291 |
| 2011/0166710 A1* | 7/2011 | Kordik ...................... H02J 3/14 700/277 |
| 2012/0105098 A1 | 5/2012 | Hancock et al. |
| 2012/0271576 A1 | 10/2012 | Kamel et al. |
| 2013/0096858 A1* | 4/2013 | Amano ............. G01R 31/3651 702/63 |
| 2013/0201316 A1* | 8/2013 | Binder .................... H04L 67/12 348/77 |
| 2013/0302161 A1* | 11/2013 | Koerber ................... F03D 7/04 416/1 |
| 2014/0354234 A1* | 12/2014 | Sudan ...................... H02J 7/34 320/127 |

FOREIGN PATENT DOCUMENTS

| | | |
|---|---|---|
| JP | 2008295193 A | 12/2008 |
| WO | 2008020667 A1 | 2/2008 |

OTHER PUBLICATIONS

Notification of Transmittal of the International Search Report and the Written Opinion of the International Searching Authority from corresponding PCT/US2013/022155 dated Mar. 29, 2013.

* cited by examiner

MONITORING LOAD OPERATION

RELATED APPLICATION

This application is a U.S. National Stage Application under 35 U.S.C. § 371 of International Application No. PCT/US2013/022155, filed Jan. 18, 2013, which is hereby incorporated herein by reference in its entirety.

BACKGROUND

Field of Invention

At least some embodiments of the disclosed herein relate to systems and methods for monitoring loads.

Discussion of Related Art

Facilities often rely on electricity to operate numerous systems. Facilities can draw the electricity from an electric utility, but also have a generator to use as a backup in case of power failure or other problems.

An uninterruptible power supply (UPS) is used to provide backup power to an electrical device, or load, when the primary power source, or mains, fails. Typical loads include computer systems, but other loads, such as heating/cooling/ventilation systems, lighting systems, network switches and routers, and security and data center management systems may also be powered by a UPS. A UPS designed for data center or industrial use may provide backup power for loads of between 1 and 20 kVA for several hours. It is often useful to have information about the power drawn by loads at the facility.

SUMMARY

At least one aspect disclosed herein is directed to a load monitoring system for a facility. The load monitoring system may include a computer system configured to execute a model of the object, the model configured to estimate a state of the object as a function of measured values of at least one characteristic of the object, receive at least one measured value of the at least one characteristic of the object, and execute, by the computer system, the model to compute an estimated state of the object.

In some embodiments, the system further includes a plurality of sensors configured to measure the at least one characteristic of the object.

In some embodiments, the plurality of sensors is further configured to transmit the at least one measured value of the at least one characteristic to the computer system.

In some embodiments, the object is an electrical load.

In some embodiments, the system further includes an uninterruptible power supply (UPS), and the load receives power from the UPS.

In some embodiments, the at least one characteristic comprises a plurality of characteristics of the load that change with operation of the load.

In some embodiments, computing the estimated state of the object comprises computing an estimated load power usage.

In some embodiments, the at least one characteristic comprises vibration of the load.

In some embodiments, the at least one characteristic comprises current drawn by the load.

Aspects also include a method of monitoring states of an object, the method including receiving, by a computer system, at least one measured value of at least one characteristic of the object, executing, by the computer system, a model of the object, the model configured to estimate a state of the object as a function of measured values of the at least one characteristic, and executing, by the computer system, the model to compute an estimated state of the object.

Aspects also include a non-transitory computer readable medium having stored thereon sequences of instruction for predicting available run time for a generator including instructions that will cause at least one processor to execute a model of the object, the model configured to estimate a state of the object as a function of measured values of at least one characteristic of the object, receive at least one measured value of the at least one characteristic of the object, and execute, by the computer system, the model to compute an estimated state of the object.

Still other aspects, examples and advantages of these exemplary aspects and examples, are discussed in detail below. Moreover, it is to be understood that both the foregoing information and the following detailed description are merely illustrative examples of various aspects and examples, and are intended to provide an overview or framework for understanding the nature and character of the claimed aspects and examples. Any example disclosed herein may be combined with any other example. References to "an example," "some examples," "an alternate example," "various examples," "one example," "at least one example," "this and other examples" or the like are not necessarily mutually exclusive and are intended to indicate that a particular feature, structure, or characteristic described in connection with the example may be included in at least one example. The appearances of such terms herein are not necessarily all referring to the same example.

BRIEF DESCRIPTION OF DRAWINGS

Various aspects of at least one example are discussed below with reference to the accompanying figures, which are not intended to be drawn to scale. The figures are included to provide an illustration and a further understanding of the various aspects and examples, and are incorporated in and constitute a part of this specification, but are not intended as a definition of the limits of any particular example. The drawings, together with the remainder of the specification, serve to explain principles and operations of the described and claimed aspects and examples. In the figures, each identical or nearly identical component that is illustrated in various figures is represented by a like numeral. For purposes of clarity, not every component may be labeled in every figure. In the figures:

DETAILED DESCRIPTION

In at least some aspects and embodiments disclosed herein, a load monitoring system including a plurality of sensors is provided. Such a load monitoring system can contribute to more accurate information of load operation by monitoring loads using models along with intermittent measurements from the plurality of sensors. The sensors can be energy harvesting wireless sensors, each designed to acquire and transmit measurements of one characteristic of the load. The sensors can harvest energy from the characteristic the sensor is designed to measure. The models can be configured to estimate load operation based on intermittent measurement values. The monitored characteristics, sensors, application, and location of the sensors can be selected to optimize accuracy of the estimates.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, components, elements or acts of the systems and methods herein referred to in the singular may also embrace examples including a plurality, and any references in plural to any example, component, element or act herein may also embrace examples including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
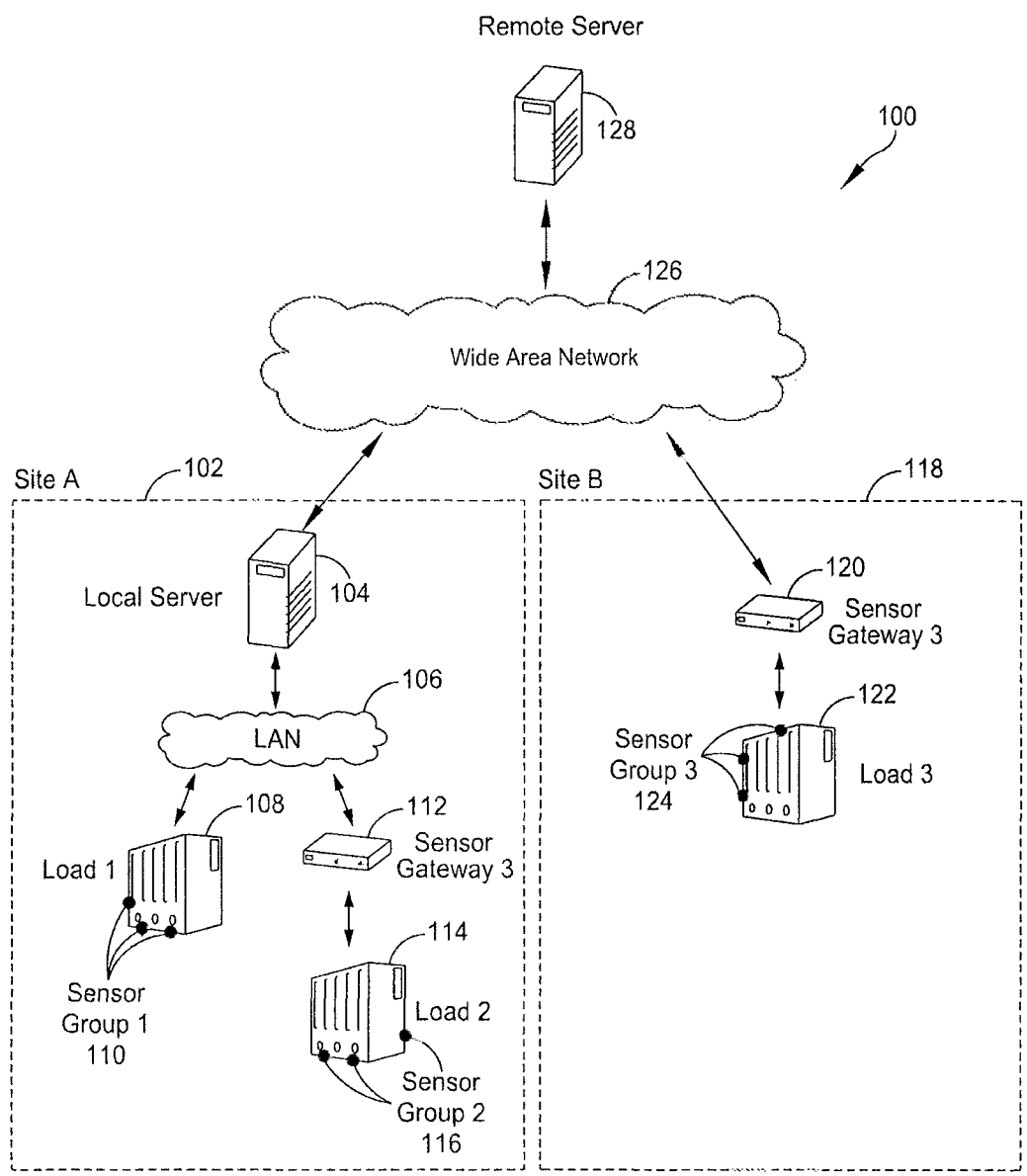
FIG. 1 is a block diagram of a load monitoring system according to aspects of some embodiments.

FIG. 1 shows an example block diagram of a load monitoring system 100 according to some embodiments. The load monitoring system 100 includes a first site 102 with a local server 104 connected to a network, such as a local area network (LAN) 106. The first site 102 also includes a first load 108 and a second load 114 monitored by a first sensor group 110 and a second sensor group 116, respectively. The first sensor group 110 is also connected to the LAN 106 and can communicate with the local server 104. The second sensor group 116 is connected to a communication gateway 112, which is connected to the LAN 106 and can communicate to the local server 104. The sensor groups 110, 116 monitor one or more characteristics of the loads 108, 114 and transmit data to the local server 104 via the LAN 106.

The load monitoring system 100 also includes a second site 118 with a communication gateway 120. The second site 118 also includes a third load 122 monitored by a third sensor group 124. The third sensor group 124 monitors one or more characteristics of the third load 122 and transmits data to the communication gateway 120. The connections between servers, sensors, gateways, and networks can be physical and/or wireless.

The load monitoring system 100 also includes a remote server 128 connected to a network, such as a wide area network (WAN) 126. The local server 104 of the first site 102 is also connected to the WAN 126 and can communicate with the remote server 128. The communication gateway 120 of the second site 118 is also connected to the WAN 126 and can also communicate with the remote server 128. The remote server 128 receives data from the local server 104 and the communication gateway 120 relating to the one or more characteristics of the loads 110, 114, 122.

The characteristics that are monitored include measurable quantitative properties associated with the load. For example, characteristics can include voltage, current, instantaneous power drawn, temperature, vibration and other appropriate properties. Each of the sensor groups 110, 116, 124 includes one or more sensors. In some embodiments, the sensors are energy harvesting wireless sensors, which each provide measurements of one characteristic. A plurality of different types of such sensors can be deployed on a load to measure different characteristics. For example, a current sensor, temperature sensor, and vibration sensor can be deployed on an air conditioning unit to monitor the operation of the unit. The energy harvesting wireless sensors harvest power from the environment in which the sensors are deployed, allowing the sensors to operate for extensive periods of time.

In some embodiments, the sensors conserve power by transmitting measurements intermittently. In some embodiments, the sensors are configured to broadcast measurements only when the sensors receive enough energy from the load being monitored by the sensor. For example, a sensor configured to monitor and report vibration can draw energy from the vibration of the load. Further, when the load is not vibrating, the sensor may not need to operate, as the measurements may be negligible. In some embodiments, the sensors store energy when available, for example, in a battery, and broadcast measurements on a more periodic schedule. In some embodiments, the measurements can be affected by the sensor drawing power from the characteristic being measured, especially if more than one sensor is drawing power. Such effects can be taken into consideration by the system, for example, by the remote server 128 when receiving measurements. For example, the remote server 128 can adjust a received measurement by a known amount based on the number of sensors that are known to be drawing power when the measurement is taken.

The load monitoring system can monitor the loads while receiving intermittent measurements by deploying a plurality of sensors and creating models of the load operation. The models include functions that take measurement samples from the sensors as inputs and generate estimated load operation as outputs.

The loads include devices and systems that use power. The loads that are monitored can comprise one device or a plurality of devices. For example, the load can be a building and the power drawn by all the devices and systems in the building, including heating, air conditioning, and ventilation (HVAC), electricity used by lights, computers, and other devices. The load can also be monitored on more granular levels, such as a monitor for the HVAC system and a monitor for the lighting system. Multiple sensors can be used on multiple levels of loads.

Figure 2:
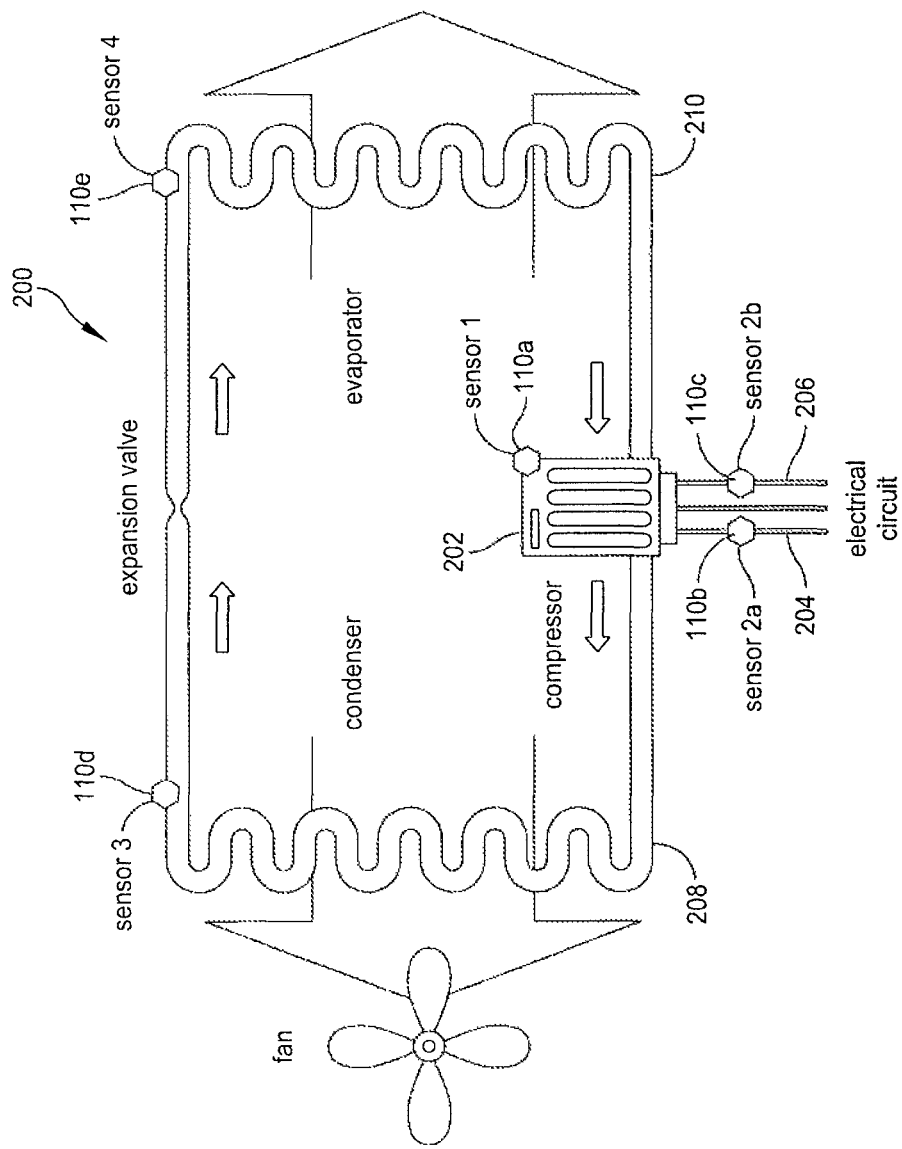
FIG. 2 illustrates an example sensor configuration on a load according to aspects of some embodiments.

For example, the first site 102 can be a building, and the first load 108 can be a heat pump. The first sensor group 110 can be deployed on a heat pump 200 as shown in FIG. 2. The first sensor group 110 includes five sensors 110a, 110b, 110c, 110d, 110e. The first sensor 110a is a vibration sensor that monitors vibrations of a compressor 202 of the heat pump 200. The second sensor 110b and the third sensor 110c are current sensors that monitor an electrical current drawn by the compressor 202. The fourth sensor 110d is a temperature sensor that monitors the temperature of a condenser coil 208 of the heat pump 200. The fifth sensor 110e is a temperature sensor that monitors the temperature of an evaporator coil 210 of the heat pump 200. The sensors 110a, 110b, 110c, 110d, 110e are designed to measure, store, and transmit measurement values for a single physical property. The sensors 110a, 110b, 110c, 110d, 110e are designed to use small amounts of power when acquiring and transmitting measurement values and often consume a minimal amount of power in a sleep state in between measurements.

As the heat pump 200 enters an on state, the compressor 202 also turns on and the compressor motor enters an on state. The compressor 202 starts vibrating as the motor runs, which can be measured by the first sensor 110a. The first sensor 110a can wake up periodically to take measurements. Alternatively or additionally, the first sensor 110a can wake up based on the turning on of the compressor 202. As the compressor begins vibrating, the first sensor 110a receives power, which can signal to the first sensor 110a to wake up, acquire, and transmit a measurement. In some embodiments, the first sensor 110a can wake up aperiodically to acquire and transmit measurements.

The activation of the compressor 202 will also produce a change in a current drawn by the compressor 202. The second and third sensors 110b, 110c can measure the current into and/or out of the compressor 202. The second and third sensors 110b, 110c can operate in a manner similar to that described above with regard to the first sensor 110a, except drawing energy from the current drawn by the compressor 202.

The fourth sensor 110d can measure the temperature changes in the condenser coil 208 produced by the operation of the compressor 202 and the heat pump 200. The fifth sensor 110e can measure the temperature changes in the evaporator coil 210. The fourth and fifth sensors 110d, 110e can also operate in a manner similar to that described above with regard to the first sensor 110, except drawing thermal energy from the condenser coil and the evaporator coil, respectively.

In some embodiments, the sensors 110a, 110b, 110c, 110d, 110e are designed to broadcast measurement values as the values are acquired. The communication protocols for the sensors 110a, 110b, 110c, 110d, 110e can be optimized for power conservation. For example, the sensors 110a, 110b, 110c, 110d, 110e can check to see if a communication channel is open, and broadcast the measurement values if the channel is available. Power consumption can be lessened by not receiving messages or sending protocol-specific messages, such as acknowledgements or authentication. The sensors 110a, 110b, 110c, 110d, 110e can be configured to wait a random amount of time if the broadcast channel is found to be in use, to minimize communication conflicts among sensors. Example sensors which can be used include sensors available from EnOcean® Inc., of Boston, Mass. and sensors available from Digi-Key Corporation of Thief River Falls, Minn.

The sensors 110a, 110b, 110c, 110d, 110e transmit the measurement values to a server, such as the local server 104. Sensors can transmit data to a server via a network and/or via an intermediate device, such as a communication gateway, an intermediate server, or other computing device. The local server 104 can transmit the measurements to the remote server 128. The remote server 128 can analyze the measurement data.

Figure 3:
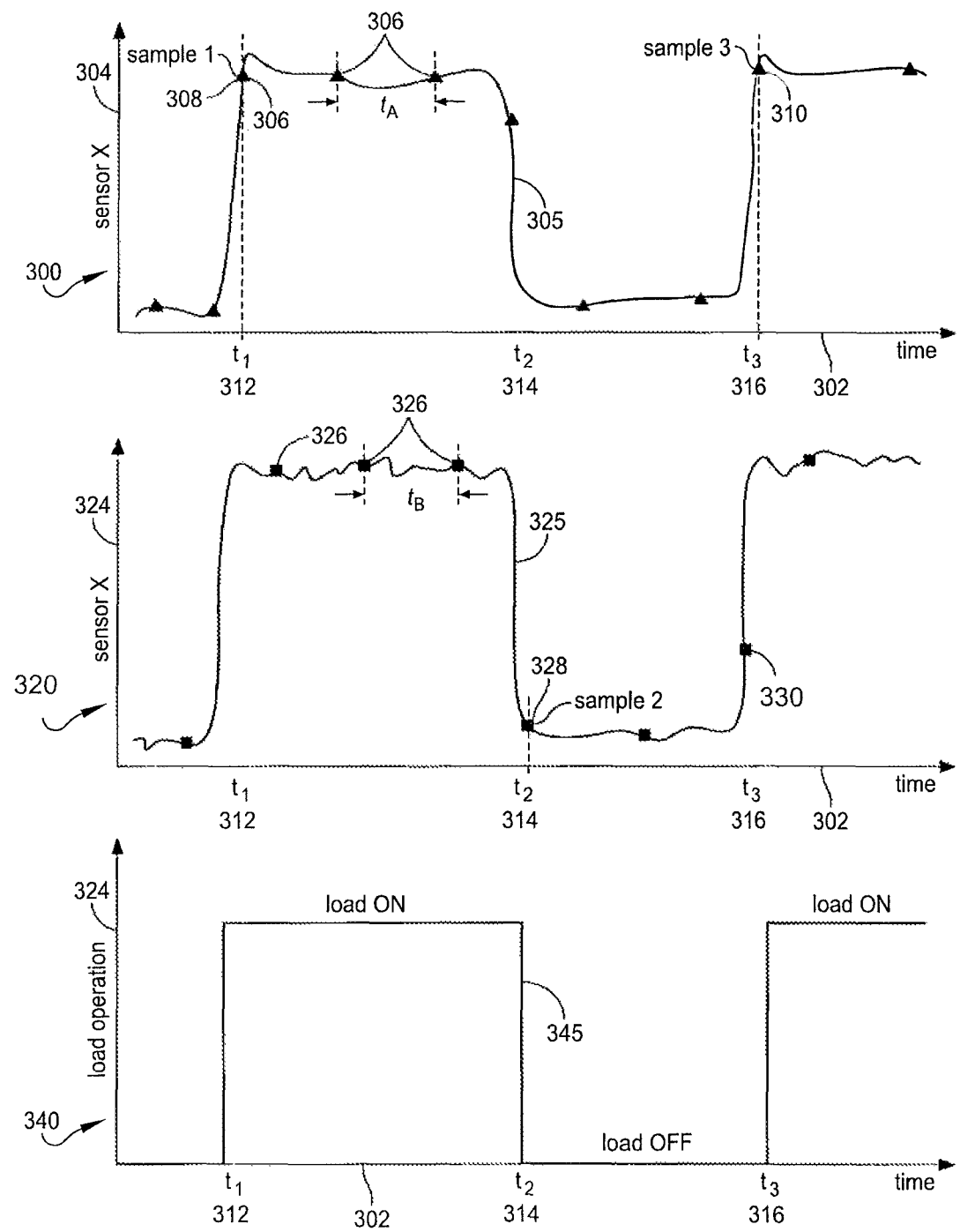
FIG. 3 illustrates an example load profile according to aspects of some embodiments.

For example, FIG. 3 shows an example profile of the heat pump 200. A first graph 300 can show measurements received from the second sensor 110b. The x-axis is time 302 and the y-axis is current 304. A line plot 305 shows the actual current at the location of the second sensor 110b, which the second sensor 110b intermittently measures. The triangles show the intermittent measurement values 306 acquired by the second sensor 110b and received by the remote server 128. The measurement values 306 are acquired at a constant time interval $t_A$.

A second graph 320 shows measurements received from the third sensor 110c. The x-axis shows the same time 302 as the first graph 300. The y-axis is current 324. A line plot 325 shows the actual current at the location of the third sensor 110c, which the third sensor 110c intermittently measures. The squares show the intermittent measurement values 326 acquired by the third sensor 110c and received by the remote server 128. The measurement values 326 are acquired at a constant time interval $t_B$. The time interval $t_B$ can be the same time interval as $t_A$, staggered so that the measurements are received at different times. Alternatively, the time intervals $t_A$ and $t_B$ can be different time intervals.

A third graph 340 shows an estimated profile 345 of the state of the load based on the received measurement values 306, 326. The estimated profile 345 is generated by the remote server 128 using the measurement values 306, 326 and a model. The estimated profile 345 shows the estimated state of the load, specifically the compressor 202 in this example, and whether the compressor 202 is on or off. The model includes a function that receives input measurement values and generates an output estimated state. For example, the function can compare a received measurement value from either the second sensor 110b or the third sensor 110c to a threshold value. If the measurement value is above the threshold value, the compressor is estimated to be on. If a measurement value from either of the sensors 110b, 110c is received and is below the threshold value, the compressor is estimated to be off. Using this model, the remote server 128 receives at a time $t_1$ 312 a measurement value 308 from the second sensor 110b. The measurement value 308 is determined to be above the threshold, and thus the estimated load profile 345 shows the load as activating at time $t_1$ 312. The estimated load profile 345 shows the load to be on until the next received measurement value that is below the threshold. At a time $t_2$ 314, the remote server 128 receives a measurement value 328 from the third sensor 110c that is below the threshold value. Thus, the estimated load profile 345 shows the load turning off at time $t_2$ 314. The estimated load profile 345 shows the compressor 202 remaining off until the next received measurement value that is above the threshold. At a time $t_3$ 316, a measurement value 310 is received from the second sensor 110b that is above the threshold. The estimated load profile 345 shows the compressor to turn on at time $t_3$ 316.

In some embodiments, a comprehensive understanding of the load and the selection and application of the sensors can improve accuracy of the estimated profile. In some embodiments, the sensors can be configured to transmit measurements based on detected changes in the characteristics to more accurately reflect the changes in the state of the load. In some embodiments, the measurements can also be used to more accurately estimate the state of the load. For example, in addition to a threshold value determining whether the load is on or off, the values of the measurements can be used to estimate more closely when in between the received measurements that the load turned on or off. For example, a received measurement value 330 can have an intermediate value, between values that are typically measured for an on state or an off state. Such intermediate value measurement values can be used to determine that the load transitioned states at or near the time of the measurement if the measurement values before and after are on opposite sides of the threshold. The value of an intermediate measurement itself can also be used to calculate (e.g., interpolate) an estimated transition time that more accurately reflects the actual transition time.

In some embodiments, the plurality of sensors provides redundancy of data for estimating the load profile. For example, having two current sensors, 110b and 110c can allow the remote server 128 to continue to receive current measurement data if one of the current sensors fails. Additionally, if both current sensors fail, the remote server 128 can continue to estimate the load profile from measurement data received from other sensors, such as the vibration sensor. In some embodiments, the remote server 128 can communicate with the sensors. The remote server 128 can instruct the sensors to provide more or less frequent measurements. For example, if the remote server 128 stops receiving measurements from a sensor, the remote server 128 can determine that the sensor has failed and request more frequent measurements from one or more of the remaining sensors to compensate for the failed sensor.

Figure 4A:
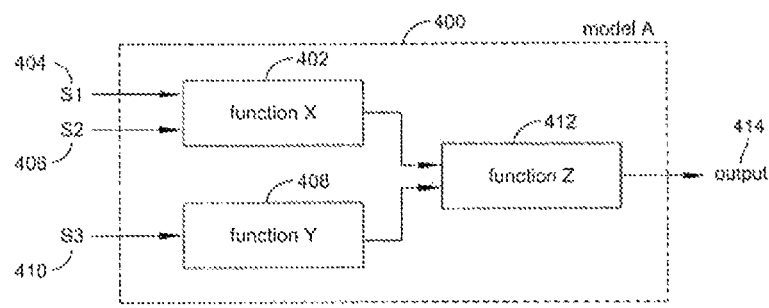
FIG. 4A illustrates an example model according to aspects of some embodiments.

FIG. 4A is an block diagram of an example model 400 for estimating a load profile. The model includes three functions 402, 408, 412 that define the relationship between the input values and the output estimated state. The functions 402, 408, 412 operate on input measurement values 404, 406, 410 each from a different sensor.

For example, the model 400 includes a function X 402, which receives an input S1 404 and an input S2 406. Function X 402 can be the model described with reference to FIG. 3. Input S1 404 can be measurement values received from the second sensor 110b and input S2 406 can be measurement values received from the third sensor 110c. Function X 402 receives the input measurement values and evaluates the inputs, for example, comparing the inputs to threshold values. The output of function X 402 can be an on state or an off state, based on the received inputs 404, 406, as described above.

The model 400 also includes a function Y 408, which receives in input S3 410. The input S3 410 can be measurement values from the first sensor 110a, which measures vibrations on the compressor 202. Function Y 408 can evaluate the measurement values of input S3 410 and compare the measurement values to a threshold value representing on and off states of the compressor 202. If a received measurement value is below the threshold value, function Y 408 outputs "OFF." If a received measurement value is above the threshold value, function Y 408 outputs "ON."

The model 400 includes a function Z 412 which receives as inputs the outputs of function X 402 and function Y 408. The outputs of functions X 402 and Y 408 are Boolean values representing on and off. Function Z 412 can operate as a basic OR gate, and thus an output 414 of the model 400 will be an estimated state of on if either function X 402 or function Y 408 estimates that the compressor 202 is on. The model 400 can be implemented in hardware, software, firmware, or any combination thereof.

In some embodiments, the model 400 can provide estimated information beyond a basic on/off state of the load. For example, an output of the compressor 202 may vary depending on the work required to pressurize and circulate fluid through the condenser coil 208 and the evaporator coil 210. Function X 402 can define an estimated horsepower (hp) output of the compressor motor based on electrical current values received, providing a new output estimate each time a new measurement value is received from S1 404 or S2 406. Similarly, function Y 408 can define an estimated hp output of the compressor motor based on vibration magnitude values. The estimated hp outputs from functions X 402 and Y 408 can be inputs to function Z 412, which provides a final estimated hp as the output 414 of the model 400. The final estimated hp can be determined, for example, by outputting the most recently received estimate from either function X 402 or function Y 408. If inputs are received from both functions X 402 and Y 408 simultaneously, function Z 412 can prefer one of the functions as a more accurate estimate. Alternatively, function Z 412 can combine the two inputs, for example using an average or a weighted average of the two inputs.

Figure 4B:
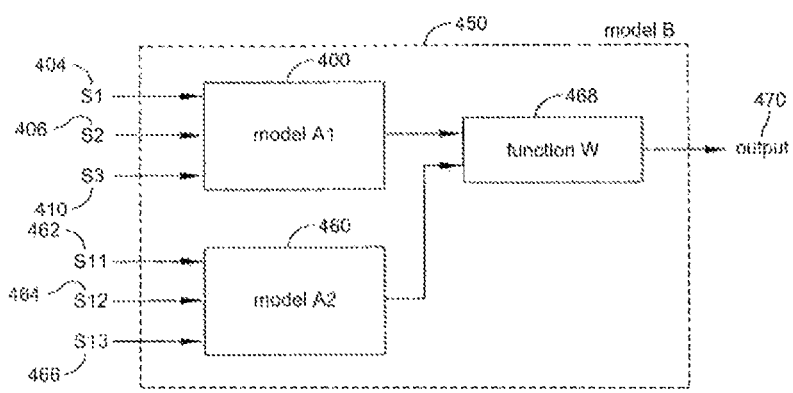
FIG. 4B illustrates an example model according to aspects of some embodiments.

FIG. 4B is a block diagram of another example model 450. The model 450 can include other models and predefined model templates. For example, the model 450 includes the model 400 of FIG. 4A. The model 400 receives inputs S1 404, S2 406, and S3 410 from the sensors on the compressor 202 as described above. The model 400 outputs an estimated on/off state of the compressor. A second model 460 can be a model similar to model 400, receiving inputs from similar sensors deployed on a fan motor of the heat pump 200. The second model 460 receives inputs S11 462 and S12 464 from current sensors monitoring the fan motor. The second model 460 also receives an input S13 466 from a vibration sensor monitoring the fan motor. The second model 460 can receive the inputs and provide an output on/off state of the fan in a manner similar to the model 400 as described above. In some embodiments, the model 400 can serve as a template. For example, the second model 460 can be a different instance of the model 400, taking in different inputs but executing the same functions on the inputs as the model 400. In some embodiments, the second model 460 can reflect changes made to the model 400. In some embodiments, the second model 460 can start as a copy of the model 400 but diverge as changes are made to the model 400 and/or the second model 460.

The model 450 can include a function W 468 that receives the outputs of the model 400 and the second model 460 to provide a final output 470 estimating the operation of the heat pump 200. Function W 468 can output the status of the compressor and fan motors separately. Alternatively or additionally, function W 468 can provide a single output that is a combination of the compressor and fan motor statuses. Alternatively or additionally, function W 468 can provide a more detailed estimate of heat pump operation, such as horsepower as described above, or estimating that the heat pump is operating in one of a plurality of standard operating modes (e.g., low, medium, high, etc.).

The outputs of the models can also include a time period since the last received measurement value. The output can also indicate if the time period between measurement values exceeds a configurable threshold. The configurable threshold can apply to all the component functions and models of the model or individual thresholds can be applied to each component. The output can also indicate an accuracy or confidence measure of the estimated load operation. The confidence measure can be based on, for example, frequency of measurement values, a time since the last received measurement value, and other metrics. The confidence measure can be a combined confidence measure of the component functions and models. The confidence measure can also provide individual confidence measures of the component functions and models.

While the example load monitoring system 100 of FIG. 1 shows a first and second site, the load monitoring system 100 can include one site or more than two sites. The sites can include one or more servers and/or one or more communication gateways. In some embodiments, the remote server is located at a site. The local server and the remote server can be implemented on the same server or server system. While the remote server has been described as receiving measurement values and generating and applying models, the processes described can also be executed on the local server and/or in part on the local server. The monitors can communicate with the servers and gateways through LANs, WANs, the Internet, or any other network. The monitors can also communicate directly with the servers and/or gateways, for example, through a serial connection. The servers and gateways can communicate via the WAN or through LANs, the Internet, or any other network. In some embodiments, the sensors communicate directly to the remote server. In some embodiments, the remote server can be a component of a service offered to the user, with the service including retrieval of stored mode of operation information, comparisons of operation between the user's load and similar loads monitored by the remote server, and other services. While the system above has been described monitoring a load that draws electricity, the system can be used to monitor loads or systems that do not use electricity.

While the system has been described using energy harvesting wireless sensors, the methods described can be implemented using sensors that receive power in other ways, such as using a battery or receiving power wirelessly. The sensors can provide measurements at regular intervals, such as every second or every minute or other appropriate interval. The sensors can provide measurements at regular intervals and also supplement regular interval measurements with measurements taken when a change is detected in the monitored characteristic. In some embodiments, the sensors provide measurements at irregular intervals that vary over time.

Various aspects and functions described herein may be implemented as specialized hardware or software components executing in one or more computer systems. There are many examples of computer systems that are currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Consequently, examples are not limited to executing on any particular system or group of systems. Further, aspects and functions may be implemented in software, hardware or firmware, or any combination thereof. Thus, aspects and functions may be implemented within methods, acts, systems, system elements and components using a variety of hardware and software configurations, and examples are not limited to any particular distributed architecture, network, or communication protocol.

Figure 5:
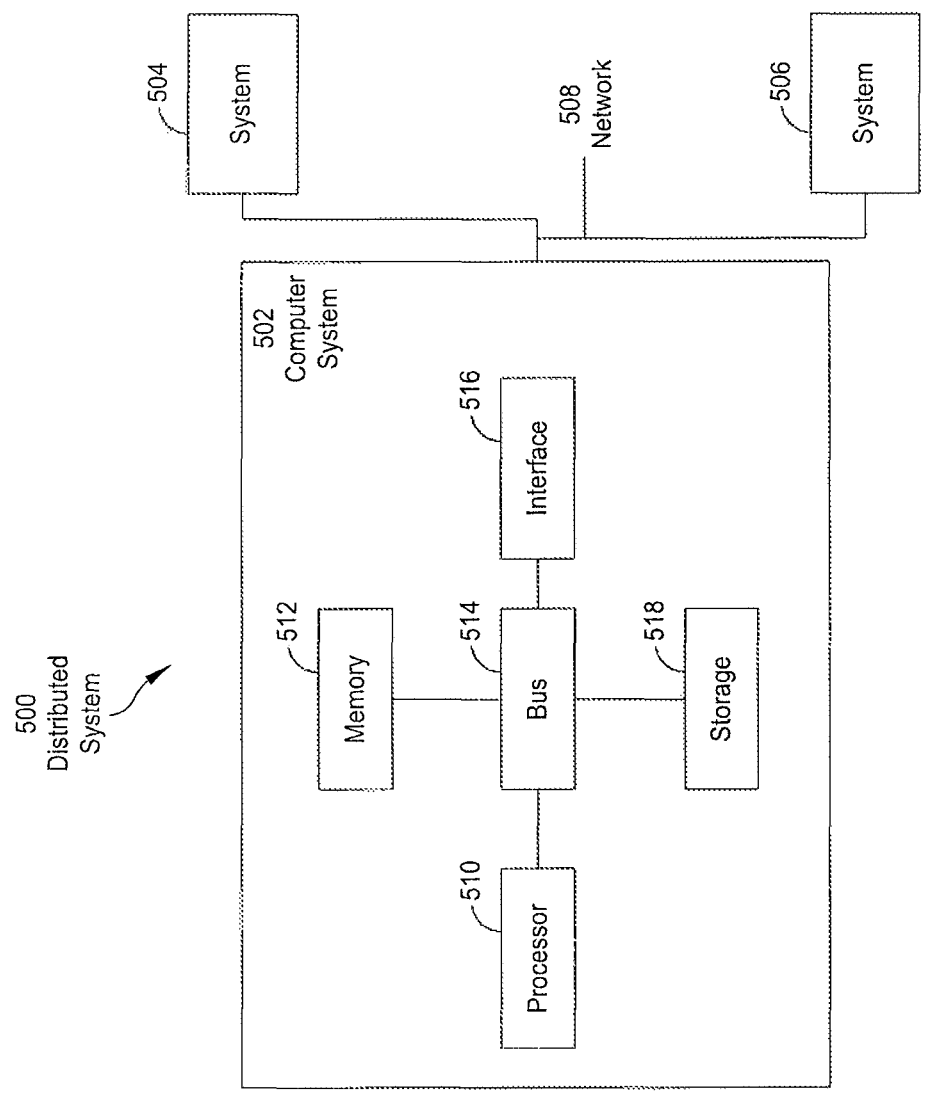
FIG. 5 is a schematic diagram of one example of a computer system that may perform processes and functions disclosed herein.

Referring to FIG. 5, there is illustrated a block diagram of a distributed computer system 500, in which various aspects and functions are practiced. As shown, the distributed computer system 500 includes one more computer systems that exchange information. More specifically, the distributed computer system 500 includes computer systems 502, 504 and 506. As shown, the computer systems 502, 504 and 506 are interconnected by, and may exchange data through, a communication network 508. The network 508 may include any communication network through which computer systems may exchange data. To exchange data using the network 508, the computer systems 502, 504 and 506 and the network 508 may use various methods, protocols and standards, including, among others, Fibre Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST and Web Services. To ensure data transfer is secure, the computer systems 502, 504 and 506 may transmit data via the network 508 using a variety of security measures including, for example, TLS, SSL or VPN. While the distributed computer system 500 illustrates three networked computer systems, the distributed computer system 500 is not so limited and may include any number of computer systems and computing devices, networked using any medium and communication protocol.

As illustrated in FIG. 5, the computer system 502 includes a processor 510, a memory 512, an interconnection element 514, an interface 516 and data storage 518. To implement at least some of the aspects, functions and processes disclosed herein, the processor 510 performs a series of instructions that result in manipulated data. The processor 510 may be any type of processor, multiprocessor or controller. Some exemplary processors include commercially available processors such as an Intel Xeon, Itanium, Core, Celeron, or Pentium processor, an AMD Opteron processor, a Sun UltraSPARC or IBM Power5+ processor and an IBM mainframe chip. The processor 510 is connected to other system components, including one or more memory devices 512, by the interconnection element 514.

The memory 512 stores programs and data during operation of the computer system 502. Thus, the memory 512 may be a relatively high performance, volatile, random access memory such as a dynamic random access memory (DRAM) or static memory (SRAM). However, the memory 512 may include any device for storing data, such as a disk drive or other non-volatile storage device. Various examples may organize the memory 512 into particularized and, in some cases, unique structures to perform the functions disclosed herein. These data structures may be sized and organized to store values for particular data and types of data.

Components of the computer system 502 are coupled by an interconnection element such as the interconnection element 514. The interconnection element 514 may include one or more physical interconnection elements, for example, interconnection elements between components that are integrated within a same machine, but may include any communication coupling between system elements including specialized or standard computing interconnection element technologies such as IDE, SCSI, PCI and InfiniBand. The interconnection element 514 enables communications, such as data and instructions, to be exchanged between system components of the computer system 502.

The computer system 502 also includes one or more interface devices 516 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 502 to exchange information and to communicate with external entities, such as users and other systems.

The data storage 518 includes a computer readable and writeable nonvolatile, or non-transitory, data storage medium in which instructions are stored that define a program or other object that is executed by the processor 510. The data storage 518 also may include information that is recorded, on or in, the medium, and that is processed by the processor 510 during execution of the program. More specifically, the information may be stored in one or more data structures specifically configured to conserve storage space or increase data exchange performance. The instructions may be persistently stored as encoded signals, and the instructions may cause the processor 510 to perform any of the functions described herein. The medium may, for example, be optical disk, magnetic disk or flash memory, among others. In operation, the processor 510 or some other controller causes data to be read from the nonvolatile recording medium into another memory, such as the memory 512, that allows for faster access to the information by the processor 510 than does the storage medium included in the data storage 518. The memory may be located in the data storage 518 or in the memory 512, however, the processor 510 manipulates the data within the memory, and then copies the data to the storage medium associated with the data storage 518 after processing is completed. The processor 510 can also manipulate the data and provide manipulated data to a user on a display and/or a communication interface. A variety of components may manage data movement between the storage medium and other memory elements and examples are not limited to particular data management components. Further, examples are not limited to a particular memory system or data storage system.

Although the computer system 502 is shown by way of example as one type of computer system upon which various aspects and functions may be practiced, aspects and functions are not limited to being implemented on the computer system 502 as shown in FIG. 5. Various aspects and functions may be practiced on one or more computers having a different architectures or components than that shown in FIG. 5. For instance, the computer system 502 may include specially programmed, special-purpose hardware, such as an application-specific integrated circuit (ASIC) tailored to perform a particular operation disclosed herein. While another example may perform the same function using a grid of several general-purpose computing devices running MAC OS System X with Motorola PowerPC processors and several specialized computing devices running proprietary hardware and operating systems.

The computer system 502 may be a computer system including an operating system that manages at least a portion of the hardware elements included in the computer system 502. In some examples, a processor or controller, such as the processor 510, executes an operating system. Examples of a particular operating system that may be executed include a Windows-based operating system, such as, Windows NT, Windows 2000 (Windows ME), Windows XP, Windows Vista or Windows 7 operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and examples are not limited to any particular operating system.

The processor 510 and operating system together define a computer platform for which application programs in high-level programming languages are written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, or C # (C-Sharp). Other object-oriented programming languages may also be used. Alternatively, functional, scripting, or logical programming languages may be used.

Additionally, various aspects and functions may be implemented in a non-programmed environment, for example, documents created in HTML, XML or other format that, when viewed in a window of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Accordingly, the functional components disclosed herein may include a wide variety of elements, e.g. specialized hardware, executable code, data structures or objects, that are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user mode application) or in a commonly shared data structure (such as an application registry that is defined by an operating system). In addition, some examples provide for both system and user interfaces that allow external entities to modify the parameters, such as sponsor types and sectors, and thereby configure the behavior of the components.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for monitoring states of an electric load powered from a power supply, the system comprising:
a plurality of sensors configured to measure at least one characteristic of the load and transmit at least one measured value of the at least one characteristic of the load, the plurality of sensors including an electrical sensor and one of a vibration sensor or a thermal sensor, wherein at least one of the plurality of sensors can measure the at least one characteristic without drawing power from the power supply; and
a computer system configured to:

execute a model of the load, the model configured to estimate a state of the load as a function of the at least one measured value of the at least one characteristic of the load, the at least one measured value including a first value measured by the electrical sensor and a second value measured by the vibration sensor or the thermal sensor;

receive the at least one measured value of the at least one characteristic of the load from the plurality of sensors; and determine, by the computer system, in response to executing the model of the load and receiving the at least one measured value, that the at least one measured value is an intermediate value having a value between a value corresponding to an ON state of the load and a value corresponding to an OFF state of the load, and based on the intermediate value determine an estimated transition time between the ON state and the OFF state.

2. The system of claim 1, wherein the plurality of sensors is further configured to transmit the at least one measured value of the at least one characteristic to the computer system.

3. The system of claim 1, wherein the at least one characteristic changes with operation of the load.

4. The system of claim 1, wherein computing the estimated state of the object comprises computing an estimated load power usage.

5. The system of claim 3, wherein the at least one characteristic comprises vibration of the load.

6. The system of claim 3, wherein the at least one characteristic comprises current drawn by the load.

7. A method of monitoring states of an electric load, the method comprising:

providing power to the load via a power supply;

detecting, by a plurality of sensors including an electrical sensor and one of a vibration sensor or a thermal sensor, at least one characteristic of the load, wherein at least one of the plurality of sensors can measure the at least one characteristic without drawing power from the power supply;

transmitting at least one measured value of the at least one characteristic of the load from the plurality of sensors to a computer system;

receiving, by the computer system, the at least one measured value of the at least one characteristic of the load transmitted by the plurality of sensors;

executing, by the computer system, a model of the load, the model configured to estimate a state of the load as a function of the at least one measured value of the at least one characteristic, the at least one measured value including a first value measured by the electrical sensor and a second value measured by the vibration sensor or the thermal sensor; and determining, by the computer system, in response to executing the model of the load and receiving the at least one measured value, that the at least one measured value is an intermediate value having a value between a value corresponding to an ON state of the load and a value corresponding to an OFF state of the load, and based on the intermediate value determine an estimated transition time between the ON state and the OFF state.

8. The method of claim 7, further comprising:

transmitting, by each of the plurality of sensors, at least one measured value of the at least one characteristic to the computer system.

9. The method of claim 7, wherein the at least one characteristic of the load changes with operation of the load.

10. The method of claim 7, further comprising identifying locations on the load to deploy the sensors.

11. The method of claim 10, wherein the plurality of sensors are configured to measure at least two different characteristics of the load.

12. The method of claim 7, wherein computing the estimated state of the load comprises computing an estimated load power usage.

13. The method of claim 7, wherein measuring at least one characteristic of the load comprises measuring vibration of the load.

14. The method of claim 7, wherein measuring at least one characteristic of the load comprises measuring current drawn by the load.

15. A non-transitory computer readable medium having stored thereon sequences of instruction including instructions that will cause at least one processor to:

detect, by a plurality of sensors including an electrical sensor and one of a vibration sensor or a thermal sensor, at least one characteristic of a load;

execute a model of the load, the model configured to estimate a state of the load as a function of at least one measured values of at the least one characteristic of the load, the at least one measured value including a first value measured by the electrical sensor and a second value measured by the vibration sensor or the thermal sensor;

receive the at least one measured value of the at least one characteristic of the load via the plurality of sensors; and determine, by the computer system, in response to executing the model of the load and receiving the at least one measured value, that the at least one measured value is an intermediate value having a value between a value corresponding to an ON state of the load and a value corresponding to an OFF state of the load, and based on the intermediate value determine an estimated transition time between the ON state and the OFF state.

* * * * *